United States Patent

Sogard et al.

(10) Patent No.: US 8,767,174 B2
(45) Date of Patent: Jul. 1, 2014

(54) TEMPERATURE-CONTROLLED HOLDING DEVICES FOR PLANAR ARTICLES

(75) Inventors: Michael R. Sogard, Menlo Park, CA (US); Alton H. Phillips, East Palo Alto, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 462 days.

(21) Appl. No.: 13/026,129

(22) Filed: Feb. 11, 2011

(65) Prior Publication Data

US 2011/0211178 A1    Sep. 1, 2011

Related U.S. Application Data

(60) Provisional application No. 61/305,884, filed on Feb. 18, 2010.

(51) Int. Cl.
*G03B 27/42*    (2006.01)
(52) U.S. Cl.
USPC .................... 355/53; 355/55; 355/72; 355/77
(58) Field of Classification Search
CPC .. G03F 7/70716; G03F 7/70875; G02B 7/185
USPC ........................ 355/30, 53, 72, 55, 63, 67, 77
See application file for complete search history.

(56) References Cited

U.S. PATENT DOCUMENTS

| | | | |
|---|---|---|---|
| 5,063,582 A * | 11/1991 | Mori et al. | 378/34 |
| 5,528,118 A | 6/1996 | Lee | |
| 5,577,552 A * | 11/1996 | Ebinuma et al. | 165/296 |
| 5,623,853 A | 4/1997 | Novak et al. | |
| 5,668,672 A | 9/1997 | Oomura | |
| 5,689,377 A | 11/1997 | Takahashi | |

(Continued)

FOREIGN PATENT DOCUMENTS

| | | |
|---|---|---|
| JP | 08-330224 | 12/1996 |
| JP | 2008-166475 | 7/2008 |

OTHER PUBLICATIONS

Howells, "Some Ideas on the Choice of Designs and Materials for Cooled Mirrors," *Advanced Light Source, Lawrence Berkeley Laboratory, University of California*, 24 pages (1995).
SEMI P37-1101, "Specification for Extreme Ultraviolet Lithography Mask Substrates," *Semiconductor Equipment and Materials International*, 9 pages (2001).

(Continued)

*Primary Examiner* — Steven H Whitesell Gordon
*Assistant Examiner* — Mesfin T Asfaw
(74) *Attorney, Agent, or Firm* — Klarquist Sparkman, LLP

(57) ABSTRACT

An exemplary apparatus includes a controllably movable body, a holding device, and a coolant circulation device. The body comprises a wall including a planar contact surface that receives the reverse surface of the article. The wall co-extends with at least a heat-receiving area of the utility surface whenever the article is being held by the body. The wall also includes a second surface separated from but proximal to the contact surface, and is thermally conductive from the contact surface to the second surface. The holding device holds the article to the contact surface with the reverse surface contacting the contact surface. The coolant circulation device delivers flow of a coolant fluid to the second surface to urge conduction of heat from the contact surface to the second surface. The holding device and coolant-circulation device operate in concert to actively control shape of the article being held by the apparatus.

44 Claims, 8 Drawing Sheets

(56) References Cited

U.S. PATENT DOCUMENTS

| | | | |
|---|---|---|---|
| 5,835,275 | A | 11/1998 | Takahashi et al. |
| 5,874,820 | A | 2/1999 | Lee |
| 7,106,416 | B2 | 9/2006 | Box et al. |
| 7,355,308 | B2 | 4/2008 | Hazelton |
| 7,591,561 | B2 | 9/2009 | Phillips et al. |
| 2004/0012767 | A1* | 1/2004 | Van Elp et al. ............ 355/72 |
| 2007/0046910 | A1 | 3/2007 | Poon et al. |
| 2007/0091485 | A1 | 4/2007 | Phillips et al. |
| 2008/0109178 | A1 | 5/2008 | Sogard et al. |
| 2009/0122428 | A1 | 5/2009 | Phillips et al. |
| 2010/0195074 | A1 | 8/2010 | Sogard |

OTHER PUBLICATIONS

SEMI P40-1103, "Specification for Mounting Requirements and Alignment Reference Locations for Extreme Ultraviolet Lithography Masks," *Semiconductor Equipment and Materials International*, 6 pages (2003).

Sogard et al., "Analysis of Coulomb and Johnsen-Rahbek Electrostatic Chuck Performance for Extreme Ultraviolet Lithography," *J. Vac. Sci. Technol B*, 25:2155-2161 (2007).

Sogard et al., "Analysis of Coulomb and Johnsen-Rahbek Electrostatic Chuck Performance in the Presence of Particles for EUV Lithography," *Proc. of SPIE* 7271:72710H1-72710H14 (2009).

"Time Constraint," *Wikipedia* 6 pages (2009).

* cited by examiner

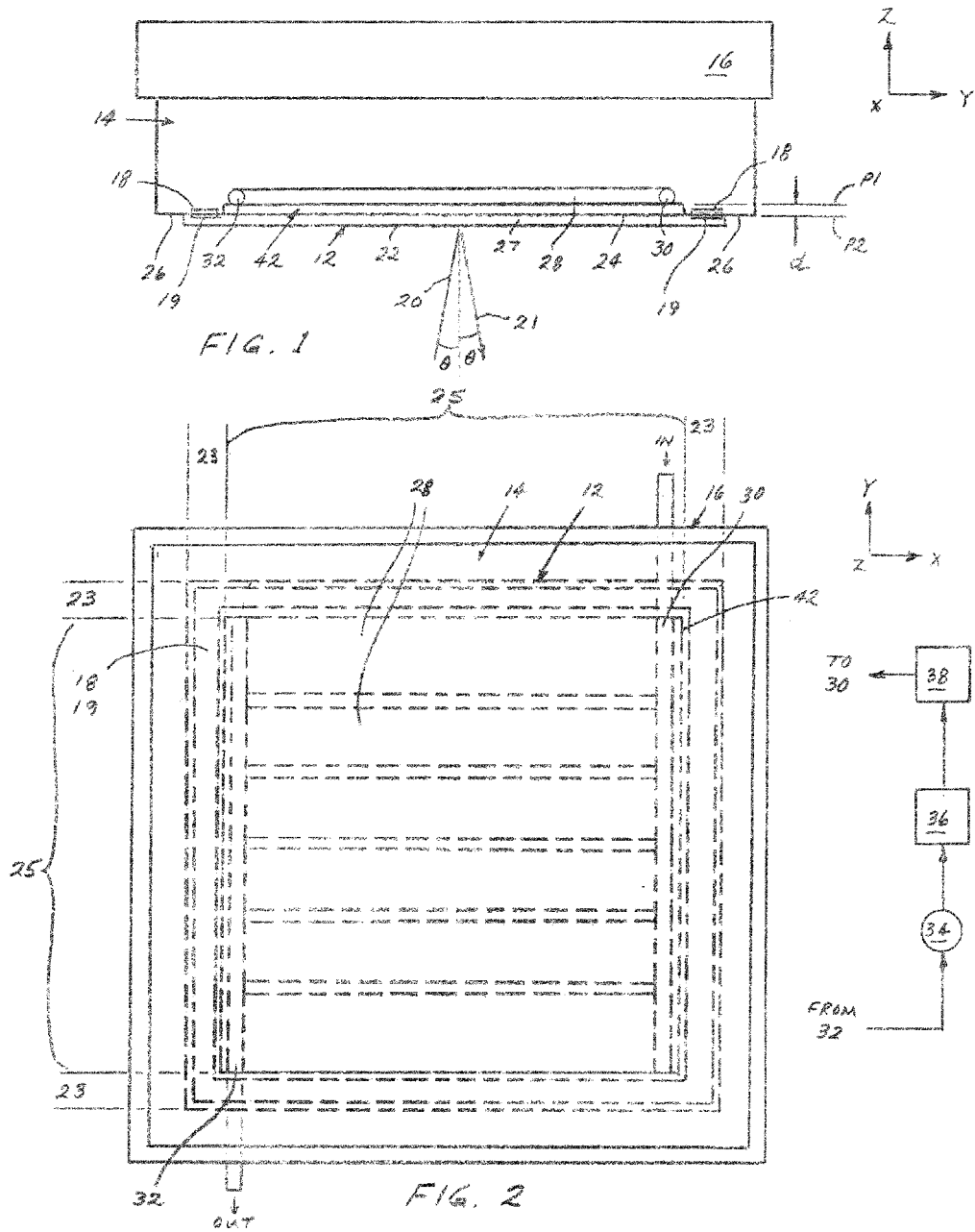

TEMPERATURE-CONTROLLED HOLDING DEVICES FOR PLANAR ARTICLES

CROSS-REFERENCE TO RELATED APPLICATION

This application claims priority to, and the benefit of, U.S. Provisional Patent Application No. 61/305,884, filed on Feb. 18, 2010, which is incorporated herein by reference in its entirety.

FIELD

This disclosure is directed to, inter alia, precision systems that perform an action on a workpiece, such as microlithography systems used in fabrication of semiconductor devices, displays, and other micro-devices. More specifically, the disclosure is directed to chucks and analogous devices used in these various systems for holding planar objects, such as reticles, while coping with high heat loads characteristic of their normal working environment without exhibiting significant thermal displacement, distortion, or the like. Potentially high heat loads on reticles are encountered in, for example, extreme UV lithography (EUVL) systems.

BACKGROUND

Much current "high technology" involves the use of precision systems that perform actions or processes on workpieces. The scope of possible actions is wide, including but not limited to cutting, machining, polishing, roughening, forming, applying finishes or coatings, surface treating, patterning, treating, chemically modifying, assembling, inspecting, measuring, etc. In many instances, these actions require very accurate and precise positioning of workpieces, process components, and the like. Also, in many instances the actions are performed under environmental conditions that are or should be controlled to minimize their potentially adverse effects on the process(es) being performed by the system. For example, if a workpiece is excessively heated, particularly while being "worked" on the precision system, the workpiece may undergo excessive thermal deformation, which can decrease the accuracy and precision of the work being performed on the workpiece.

"Workpiece" is not limited to a thing to which the action is being performed by the precision system. Some precision systems use several types of workpieces, such as a first workpiece used to define the work being done by the system to a second workpiece. Examples of multiple types of workpieces are used in various microlithography systems that are important tools used for manufacturing "micro-devices" including ultraminiature electronic circuits, displays, memory chips, processor chips, etc. Most conventional microlithography systems use at least two workpieces: a first workpiece that defines a micro-pattern, and a second workpiece onto which the micro-pattern is reproduced or "transferred" from the first workpiece. The microlithography system basically comprises various holding, positioning, illuminating, and imaging subsystems that collective achieve this pattern reproduction on a series of substrates, often semiconductor "wafers," in a highly automated and controlled manner. As commercial demands for increasingly miniaturized micro-devices continue, the technical demands placed on precision systems (such as microlithography systems) used for making the micro-devices have become progressively more stringent, requiring more control and more attention being paid to parameters (such as heat-loads) that previously could be ignored.

As microlithography systems have evolved for making progressively miniaturized micro-devices, increasingly smaller wavelengths of electromagnetic radiation have been utilized. In many instances, changing to a smaller wavelength required far-reaching changes in system configuration. For example, most earlier microlithography systems used ultraviolet (UV) light for making pattern exposures. The wavelengths of UV light allowed use of refractive optical systems for illumination and/or imaging. To produce a microlithography system capable of forming smaller pattern features on a wafer than achievable using a UV microlithography system, a gigantic effort is currently underway to develop a practical microlithography system utilizing extreme ultraviolet (EUV) light. Such lithography systems are abbreviated "EUVL" systems. EUVL systems can form active circuit elements having width dimensions of approximately 35 nanometers or less. In EUVL the exposure beam has a wavelength of approximately 13.5 nm that typically is produced by a plasma source such as electric-discharge-pinch plasma or laser-produced plasma. In the latter, a pulsed laser beam heats units of xenon gas or other suitable target material to a very high temperature sufficient to create the plasma. The plasma produces intense light in a range of wavelengths including EUV wavelengths. The light is collected by a mirror and reflected through a filter to remove unwanted ("out-of-band") wavelengths. The filtered light is formed into an illumination beam by passage through an illumination-optical system. The illumination-optical system shapes and conditions the illumination beam (including making the beam substantially uniform in intensity across its transverse dimension) for illuminating a pattern-defining master called a "reticle" or "mask." Since there are no known materials useful for making EUV lenses, the illumination-optical system comprises only reflective optical elements.

In EUVL systems the reticle is a planar object that is held by a reticle chuck. The reticle chuck is mounted on a reticle stage that controllably moves the reticle chuck (and hence the reticle) in one or more desired directions of motion. For example, the reticle stage is configured to move the reticle chuck in the X-, Y-, and Z-directions, wherein the plane of the reticle extends in the X- and Y-directions, and the Z-direction is normal to the reticle plane. The reticle stage may also be configured to tilt the reticle in one or more of the $\theta_X$, $\theta_Y$, and $\theta_Z$ directions.

For use with an EUV illumination beam, the planar reticle is reflective rather than transmissive. (In other lithography systems using longer UV exposure wavelengths, the reticle is usually transmissive.) The illumination beam incident on the reticle reflects from the reticle while becoming "patterned" according to the arrangement of features on the reticle, wherein the arrangement of features on the reticle corresponds to the desired pattern to be exposed onto a lithographic substrate. An example of a "substrate" is a semiconductor wafer coated with an exposure-sensitive material called a "resist." The EUV-patterned beam reflected from the reticle passes through an imaging-optical system, also entirely reflective, to the resist-coated substrate. The substrate is mounted on a "wafer chuck" affixed to a wafer stage that controllably moves the wafer chuck (and hence the substrate) in one or more desired directions of motion. At least some wafer-stage motion is coordinated with corresponding reticle motion. The wafer stage is configured to move the wafer chuck in the X-, Y-, and Z-directions, wherein the plane of the wafer extends in the X- and Y-directions, and the Z-direction is normal to the wafer plane. The wafer stage may also be configured to tilt the substrate in one or more of the $\theta_X$, $\theta_Y$, and $\theta_Z$ directions. These motions not only ensure that pattern exposures occur at desired locations on the substrate surface, but also may be performed to ensure good focus of the images as formed on the substrate surface. The plane of the substrate surface (extending in the X- and Y-directions) is usually optically conjugate to the plane of the reticle surface from which the illumination beam reflects.

A mirror arranged to provide glancing reflection of incident EUV light reflects almost all the incident light. However, glancing-incidence mirrors are impractical for most of the mirrors in the illumination-optical system. As a result, most of the mirrors are arranged and configured to reflect light at smaller angles of incidence. In order for a mirror to exhibit acceptable reflectivity to EUV light at less than a glancing angle of incidence, it must have a multilayer coating on the intended reflective surface. Even with a multilayer-coated mirror, the greatest achievable reflectivity of EUV light is approximately 70%, wherein the remaining approximately 30% of the energy of EUV light incident on the mirrors is absorbed as heat. To avoid or minimize thermal distortion, the mirror is at least passively cooled and may be actively cooled. For active cooling, see, e.g., U.S. Pat. No. 7,591,561 to Phillips et al., incorporated herein by reference. An example of "passive" cooling is simple conduction of the heat from the mirror to a mass serving as a heat-sink. An example of active cooling is circulation of a temperature-regulated fluid through conduits in the body of the mirror.

Since the reticle is located just downstream of the illumination-optical system, the reticle is vulnerable to substantial heating. Reticle heating is exacerbated by the fact that the reticle also includes a surficial multilayer film providing the reticle with a maximal achievable reflectivity of approximately 70%, resulting in approximately 30% of incident EUV light being absorbed by the reticle as heat.

Since the reticle defines the profile of the pattern to be formed on the wafer as well as placement information for the elements of the pattern as formed on the wafer, parameters such as flatness (planarity) of the reticle are critical. Other important reasons for reticle flatness include: (a) the illumination-optical system is typically not telecentric, and (b) the imaging-optical system typically has a very small depth of focus.

Heat absorbed by the reticle (especially uneven heat absorption) can cause reticle distortion, which is the antithesis of reticle flatness. The distortion usually results in at least a portion of the reticle surface becoming displaced out of the plane conjugate to the wafer plane, which causes an image-fidelity error, an image-placement error, and/or an image-registration error. In addition, uneven heat absorption by the reticle can cause thermal distortion of the reticle within the plane conjugate to the wafer plane. Thus, temperature gradients both normal to the reticle plane and within the reticle plane can create thermal distortions that impair image quality.

Reticle-flatness specifications as promulgated by an industrial committee (SEMI) are very tight for EUVL. Example recent specifications are:

| Feature half-pitch (nm) | Reticle flatness (nm) |
|---|---|
| 45 | 50 |
| 32 | 32 |
| 22 | 23 |

Semi P37-1101, *Specification for Extreme Ultraviolet Lithography Mask Substrates* (2001). These specifications are particularly directed to the patterned area of the reticle as the reticle is being held by the reticle chuck. The patterned area is the important part of the reticle for imaging purposes and is surrounded by a peripheral zone in which alignment marks, for example, are located. Semi P40-1103, *Specification for Mounting Requirements and Alignment Reference Locations for Extreme Ultraviolet Lithography Masks* (2003). For increasingly better image resolution these specifications are progressively becoming more stringent. Meanwhile, as EUV sources are developed that produce progressively greater output power to satisfy demands for ever-increasing throughput, the thermal burdens to which EUVL reticles are vulnerable continue to increase.

SUMMARY

This invention is directed to various aspects thereof, including but not limited to devices for holding a substantially planar article, to reticle chucks, to precision systems, and to methods.

For example, one aspect of the invention is directed to apparatus for holding a substantially planar article having a utility obverse surface and a planar reverse surface. An embodiment of such an apparatus comprises a controllably movable body, a holding device, and a coolant circulation device. The body comprises a wall including a planar contact surface that receives the reverse surface of the article. The wall is substantially co-extensive with at least a heat-receiving area of the utility surface whenever the article is being held by the body. The wall also includes a second surface separated from but proximal to the contact surface, and is thermally conductive from the contact surface to the second surface. The holding device holds the article to the contact surface with the reverse surface contacting the contact surface. The coolant circulation device delivers flow of a coolant fluid to the second surface to urge conduction of heat from the contact surface to the second surface. The holding device and coolant-circulation device operate in concert to actively control shape of the article being held by the apparatus.

In many embodiments the coolant fluid is a coolant liquid. Desirably, the coolant circulation device comprises at least one conduit defined at least in part by the second surface of the wall. The apparatus can include a pump that is hydraulically connected to the at least one conduit, wherein the pump urges circulation of the coolant liquid through the at least one conduit. Among various benefits, the circulating coolant liquid removes heat from the second surface that has conducted from the article to the contact surface and from the contact surface to the second surface. Desirably, the pump circulates the cooling liquid in a substantially laminar flow through the at least one conduit, thereby avoiding production of vibrations that otherwise could degrade positional accuracy of the article as held by the apparatus. The coolant circulation device also desirably comprises a heat exchanger hydraulically connected to the pump and at least one conduit to remove heat from the circulating cooling liquid. For various benefits including heat-removal efficiency, the at least one conduit desirably is configured as an array of microchannels.

In many embodiments of the apparatus, the holding device comprises at least a first electrode serving to hold the article to the article-contact surface by electrostatic attraction. The first electrode desirably is located on the contact surface or in the wall. The holding device can include a second electrode located, for example, on or in the article. By electrically energizing the electrode(s), an electrostatic attraction is produced that urges contact of the article with the contact surface. In these and other embodiments, the contact area is substantially coextensive with a flatness quality area of the article. Example modes of electrostatic attraction include, but are not limited to, Coulombic attraction and attraction based on a Johnsen-Rahbek force.

In certain embodiments of the apparatus, the contact surface defines a first X-Y plane, and the second surface defines a second X-Y plane parallel to the first X-Y plane. In such a configuration the first and second X-Y planes are separated from each other in a Z-direction by the wall across which heat is conducted from the contact surface to the second surface. In these and other embodiments the wall can comprise respective superposed constituent layers of at least two respective materials bonded together. The materials have different respective coefficients of thermal expansion selected such that, at a given temperature and with respect to at least a portion of the layer of material, distortion of one constituent layer is at least partially offset by thermal distortion of the other constituent layer to produce a net reduced distortion of the layer of material compared to when the layer of material comprises only one of the constituent layers.

The constituent layers can be continuous over at least the contact surface. Alternatively, they can be discontinuous. At least one of the constituent layers can be patterned to provide a non-uniform distribution of thermal expansion coefficient over at least a portion of the respective constituent layer. In other embodiments one of the constituent layers has a uniform thickness, while the other of the constituent layers has a non-uniform thickness distribution over at least a portion of the respective constituent layer.

In certain embodiments the planar article comprises a reticle, wherein the body comprises a movable reticle chuck. An example reticle is a reflective reticle as used in EUV lithography. In many EUVL systems according to another aspects of the invention, the contact surface faces downward while the reverse surface of the article faces upward while the article is being held to the receiving portion by the holding device.

The foregoing and additional aspects, features, and advantages of the invention will be more apparent from the following detailed description of representative embodiments, which proceeds with reference to the accompanying drawings.

BRIEF DESCRIPTION OF THE DRAWINGS

FIG. 1 is an elevational schematic view of a portion of a reticle stage as well as an actively cooled reticle chuck and reticle according to a first embodiment.

FIG. 2 is a plan schematic view of a reticle being held on the embodiment of FIG. 1.

DETAILED DESCRIPTION

Figure 3A:
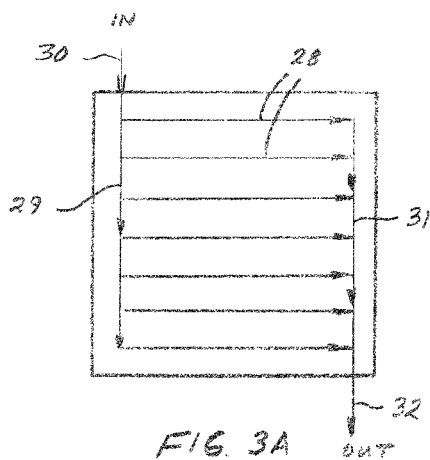
FIGS. 3A-3F are respective plan schematic views of exemplary reticle-holding surfaces that are actively cooled using any of various configurations of cooling channels, such as but not limited to microchannels.

This disclosure is set forth in the context of representative embodiments that are not intended to be limiting in any way.

As used in this application and in the claims, the singular forms "a," "an," and "the" include the plural forms unless the context clearly dictates otherwise. Additionally, the term "includes" means "comprises." Further, the term "coupled" encompasses mechanical as well as other practical ways of coupling or linking items together, and does not exclude the presence of intermediate elements between the coupled items.

The described things and methods described herein should not be construed as being limiting in any way. Instead, this disclosure is directed toward all novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Conventionally, in EUVL and other microlithography systems, the lithographic substrate and reticle are regarded as workpieces rather than respective parts of the system. For imaging, a particular reticle defining a particular pattern is placed in the microlithography system along with a resist-coated substrate. The microlithography system exposes the substrate according to the pattern on the reticle. In deriving this invention, we departed from this conventional perspective and considered the reticle not as a workpiece but rather as an optical element of the EUVL system. This change in thinking was based at least in part on the following: (a) the reticle is essentially a planar mirror; (b) the reticle comprises a surficial multilayer film and can reflect the illumination beam at a small angle of incidence; (c) the prevailing flatness specifications for the reticle are in substantially the same order as the tolerance levels for forming the optical surfaces of the mirrors of the EUVL system; (d) the reticle reflects substantially the same percent of incident EUV light as any of the multilayer-film mirrors of the EUVL system; (e) incident EUV light not reflected by the reticle is absorbed by the reticle as heat; (f) if the reticle were not present, no light of the illumination beam would enter the imaging-optical system, the imaging beam would not be formed, and the wafer would not be exposed; (g) as source power is increased, the thermal load on the reticle increases; (h) reticle distortions can have a large adverse effect on image quality on the wafer; (i) reticle flatness specifications continue to tighten; and (j) with the need for increasingly finer image resolution on the substrate, the thermal situation of the reticle can no longer be disregarded. In consideration of these points, Applicants realized the importance of preventing thermal distortion of the reticle as an optical element of the EUVL system.

We also realized several important considerations that distinguish the reticle from other optical elements. For example, whereas the other optical elements remain stationary during use, the reticle (being mounted on a reticle stage) moves. Motions can be continuous (such as during a scanning motion) or discontinuous (start-stop and "stepping" motions). Cooling a moving object using circulating fluid is difficult for various reasons such as connecting flexible fluid conduits to the moving object and minimizing vibrations produced in the flexible conduits. Substantially every movement of the reticle involves at least one acceleration and at least one deceleration; during start-stop motions, each of the accelerations and decelerations can be as much as 8×g or more. Fluids usually react differently to accelerations and decelerations than a rigid object.

Another consideration is that planarity of the reticle must be achieved and maintained to extremely tight tolerances for accurate imaging. Substantially any distortion, including thermal distortion, causes reticle bending or warping that adversely affects the planarity of the reticle. These distortions are complicated by the imaging-optical system not being telecentric. The planar reticle receives illumination light at a small (but not zero) angle of incidence. Any distortion of the reticle usually produces a displacement of at least a portion of the reticle's reflective surface out of the plane conjugate to the substrate plane. These out-of-plane distortions of the reticle tend to cause imaging displacements in the substrate plane (X-Y plane).

For making lithographic exposures the reticle is mounted on a reticle chuck, and the reticle chuck is mounted on a movable reticle stage. Some of the incident EUV illumination light is absorbed (as heat) at the surface of the reticle, and some of this absorbed heat conducts depthwise into the reticle, creating temperature differences that can distort the reticle. Conventionally, reticle heat conducts to the reticle chuck and reticle stage that passively serve as a heat sink. But, in EUV lithography, with ongoing efforts to achieve greater source power (to increase the illumination-beam intensity for decreasing exposure time and increasing throughput) and the lack of success to date in increasing reticle reflectivity to significantly more than 70%, Applicants realized the importance of cooling the reticle by actively cooling the reticle chuck, while at the same time using the reticle chuck to control the shape of the reticle mounted to it. Even if the reflective part of the reticle were to achieve 100% reflectivity, approximately 50% of the incident light energy will still be absorbed in the non-reflective part of the reticle pattern.

Another consideration we made is that, whenever the reticle is being held by the reticle chuck, a particle trapped between the reticle and chuck surface not only can cause distortion (loss of planarity) of the reticle relative to the chuck surface, but also forms a local space that interrupts local conduction of heat from the reticle to the reticle chuck. This interruption can be substantial if the reticle chuck is not actively cooled, and the interruption can produce regional temperature differences in the reticle that can cause reticle distortion.

Yet another consideration is that, in order for the reticle chuck to have control over the planarity of the reticle mounted to it, the planar surface of the reticle chuck is fabricated to very high standards and close planarity tolerances. Such a surface provides maximum heat transfer from the reticle to the chuck.

The following embodiment is an example of an apparatus, according to the invention, for holding a substantially planar article having a "utility" obverse surface and a planar reverse surface. Usually, but not necessarily always, the utility surface and reverse surface are precisely configured as respective planes that are parallel to each other. In any event, the reverse surface is planar to facilitate it being held on a planar contact surface of the apparatus.

A more specific example of the substantially planar article is a reflective reticle, of which the "utility" surface is a reflective surface (e.g., the outer surface of a multilayer film that is reflective to incident EUV light). For use as a reticle, the reflective surface includes feature-defining bodies arranged to form a "pattern" of features to be exposed from the reflective surface to an exposure-sensitive substrate.

The apparatus comprises a controllably movable body that includes a receiving portion and a cooled surface. The receiving portion includes a planar "contact surface" that receives the planar reverse surface of the article such that these two surfaces substantially fully contact each other. The planar contact surface desirably is substantially co-extensive with at least a heat-receiving area of the utility surface, to facilitate cooling of the article (by an active-cooling device) over regions thereof that will or may be heated.

The movable body also includes a cooled surface that generally extends with the contact surface. The cooled surface is separate from but proximal to the contact surface. For example, these surfaces can be separated by a wall of which a first main surface forms at least a portion of the contact surface and of which a second main surface forms at least a portion of the cooled surface. In any event, the contact surface and cooled surface are situated relative to each other to achieve conduction of heat from the contact surface to the cooled surface as the cooled surface is cooled relative to the contact surface.

The apparatus further comprises a holding device that holds the article to the receiving portion with the reverse surface being in thermal contact with the contact surface. This thermal contact is facilitated by the contact surface and reverse surface being precisely planar. The holding device can further comprise one or more components that enhance the force by which the article is held to the contact surface. Example components are electrodes (e.g., a first electrode associated with the contact surface and a second electrode associated with the reverse surface of the article) that, when energized, produce an electrostatic attraction of the article to the contact surface. Example modes of electrostatic attraction are Coulombic attraction and Johnsen-Rahbek attraction.

The apparatus further comprises an active-cooling device that controllably delivers a "cooling influence" to the cooled surface to remove heat from (i.e., "cool") the cooled surface. Cooling the cooled surface urges conduction of heat from the contact surface to the cooled surface, which urges conduction of heat from corresponding regions of the article to the movable body. Generally, but not necessarily, the cooling influence is manifest as a coolant fluid (usually, but not necessarily, a coolant liquid) that is moved (in the body) relative to the cooled surface to remove heat from the cooled surface.

By holding the reverse surface of the article to the contact surface of the body while removing heat from the article to the body, the apparatus simultaneously: (a) holds the article, (b) actively cools the article, and (c) controls the shape of the article by reducing thermal distortion and the like of the article. The holding device and active-cooling device work in concert to achieve these ends.

First Embodiment

This embodiment is directed specifically, by way of example, to an apparatus for holding a substantially planar reticle 12, wherein the reticle is a reflective reticle used, for example, in EUV lithography. (See FIG. 1.) Of this reticle, the "utility" surface is a reflective "patterned" surface that receives incident illumination light. Hence, the subject apparatus is a reticle chuck 14. As discussed above, some of the energy of illumination light impinging on the patterned surface is absorbed by the reticle as heat. This heat is conducted depth-wise through the reticle to the reticle chuck, which produces a non-uniform thermal distribution in the body of the reticle chuck.

In this embodiment the resulting temperature differences in the chuck are reduced by efficiently cooling the reticle chuck in a plane (plane P1 in FIG. 1) that is as close as practicable to the plane (plane P2 in FIG. 1) comprising the interface of the reticle with the reticle chuck ("chuck-reticle interface"). Note that planes P1 and P2 are respective parallel X-Y planes. The plane P2 is an example of a "contact surface" that, during normal operation, is contacted by the reverse surface of a reticle 12. In FIG. 1 the reticle 12 is shown attached to the reticle chuck 14. To confer movability, the reticle chuck 14 is mounted to a reticle stage 16.

The reticle chuck 14 in this embodiment is an electrostatic chuck that holds the reticle 12 by a Coulomb force or Johnsen-Rahbek force (both generally referred to as "electrostatic" forces). To such end the chuck 14 comprises an electrode 18, and the reticle 12 comprises a corresponding electrode 19. Application of an appropriate electrical potential across the electrodes 18, 19 produces the electrostatic forces. The electrodes 18, 19 desirably extend throughout the common interface between the reticle 12 and the chuck 14 to achieve maximal flatness of the reticle 12. The electrodes 18, 19 are components of this apparatus' "holding device."

EUV illumination light 20 is incident on the patterned reflective surface 22 of the reticle at a small (but not zero) angle of incidence θ and thus produces reflected light 21. The reflective surface 22, which is the obverse surface of the reticle 12, is planar to extremely tight tolerances. The reflective surface 22 defines a pattern (not shown) and is located in an X-Y plane that is conjugate to the imaging plane (not shown). The reverse surface 24 of the reticle 12 is also planar to extremely tight tolerances. The reticle 12 has a peripheral zone 23 (usually 5 to 10 mm wide) and a "flatness quality area" 25 inside the peripheral zone 23. The planarity of the reticle in the flatness quality area 25 is especially critical. Illumination of the reticle generally occurs within the flatness quality area 25; the peripheral zone 23 usually does not receive any direct illumination. Consequently, thermal stresses can accumulate in the reticle as a result of heat being generated in the flatness quality area 25 but not in the peripheral zone 23. Cooling the reticle via the reticle chuck, as described below, substantially reduces these thermal stresses.

For EUVL, various aspects of the reticle 12 are defined by industry standards, many of which are prepared, published, and occasionally updated by Semiconductor Equipment and Materials International (SEMI™). The reticle pattern is formed on a reticle substrate 27 that is square in profile, that has a defined thickness, and that is planar to extremely tight tolerances. The reticle substrate 27 also is made of a near zero thermal expansion (NZTE) material, such as titania-doped silica glass or any of several two-phase glass ceramics. Planarity of the reflective surface 22 and reverse surface 24 is especially important in the flatness quality area 25.

The reticle chuck 14 includes a chuck surface 26 that is planar to extremely tight tolerances. The chuck surface 26 defines a plane P2 that is in close contact with the reverse surface 24 of the reticle 12 whenever the reticle is being held by the reticle chuck 14. The contacting surfaces 24, 26 constitute a planar "chuck-reticle interface."

Inside the reticle chuck 14 are cooling channels 28 that conduct a coolant fluid in a manner that removes heat from the chuck surface 26 and hence from the reticle 12. The cooling channels 28 desirably are coextensive with at least the flatness quality area 25 of the reticle 12. The coolant fluid is introduced into the cooling channels 28 by one or more inlet conduits 30, and removed from the channels by one or more outlet conduits 32. The outlet conduit 32 is hydraulically coupled to a pump 34, which is hydraulically coupled to a heat exchanger 36 that removes heat from (and thus cools) the fluid. The heat-exchanger 36 delivers cooled fluid to a source 38, to which the inlet conduit 30 is hydraulically connected. The source 38 can include a reservoir of cooled fluid (not shown). The fluid can be, for example, water, an aqueous solution, Fluorinert™, an inert gas, or other suitable fluid. The fluid could also be a liquid metal, such as described in U.S. Patent Publication No. 2010/0195074, incorporated herein by reference.

The particular configuration of the cooling channels 28 can vary widely, and can include microchannels and/or other channel configurations, or combinations thereof. In this regard, reference is made to U.S. Patent Publication No. 2007/0091485 A1, incorporated herein by reference, which discusses various channel configurations. The fluid can flow in parallel or in series through the cooling channels 28. A "cooling channel" also encompasses essentially one passageway, having X-Y dimensions substantially as the reticle, situated to receive cooling fluid from the inlet conduit 30 and direct (or conduct) it to the outlet conduit 32.

Flow of fluid through the cooling channels 28 desirably is laminar or near-laminar to inhibit generation of vibrations. Whereas turbulent flow tends to produce relatively efficient heat transfer to and from the fluid, turbulent flow tends to produce undesirable vibrations. Depending on the heat removal requirements, mildly or substantially turbulent flow may be acceptable or desirable. Alternative cooling channel designs are also possible, including those noted by Howells for cooling mirrors. Howells, *Some Ideas on the Choice of Designs and Materials for Cooled Mirrors*, Lawrence Berkeley Laboratory publication no. LBL-36620, 1995, incorporated herein by reference.

Desirably, the coolant fluid flowing through the cooling channels 28 prevents significant increases in temperature of the reticle chuck 14 and reticle 12 while inhibiting or preventing the generation of vibrations. The threshold "significant" temperature increase can be preset, based on considerations of the output power of the source 38, the intensity of light actually incident on the reticle 12, the material of the reticle, the particular pattern(s) defined on the reticle, the size of the reticle, the applicable reticle-flatness standards, and other factors.

In addition to limiting the maximum temperature rise of the reticle and chuck by active cooling, it is also important to limit the variation in temperature of the reticle and chuck within a plane parallel to the surface 22, in order to limit thermal distortion within the plane of the reticle conjugate to the wafer plane.

In limiting the temperature rise of the reticle 12, the coolant fluid will typically rise in temperature somewhat with the absorption of heat from the reticle 12. This temperature rise can lead to some heat transfer into the main body of the reticle chuck 14. That in turn can create a temperature gradient in the chuck body which can cause thermal distortion of the chuck as well as distortion of the chuck-reticle interface (surfaces 24 and 26). Thus, the flow of coolant fluid must be configured to minimize heating of the chuck body 14 as well as limiting temperature rise of the reticle 12. Alternatively, or in addition, a second system of coolant channels can be provided in the chuck body above the first coolant plane P2 to minimize temperature gradients in the chuck.

Configuring the cooling channels 28 as microchannels facilitates establishment of laminar flow of the fluid through them. A "microchannel" generally has a cross-sectional profile of which at least one dimension is no greater than approximately 100 micrometers. A microchannel provides significant flow resistance and thin boundary layers, which inhibits fluid flowing along a wall of the microchannel from acting as an insulating layer. The flow resistance can be less than approximately 20 kilopascals, but depends upon the fluid flow rate through the microchannel as well as the length of the microchannel. Due to normal pressure drop, shorter and/or more numerous microchannels tend to require less fluid pressure than longer and/or fewer microchannels having the same transverse profile.

Figure 3B:
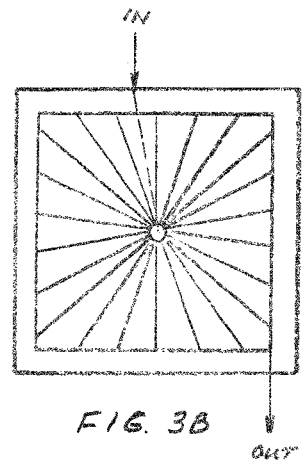
Figure 3C:
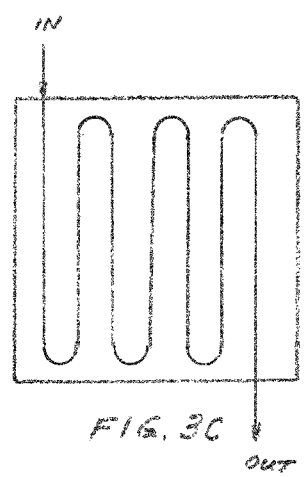
Figure 3D:
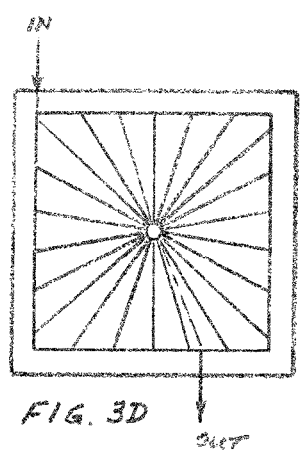
Figure 3E:
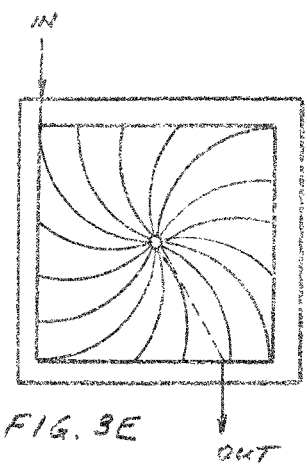
Figure 3F:
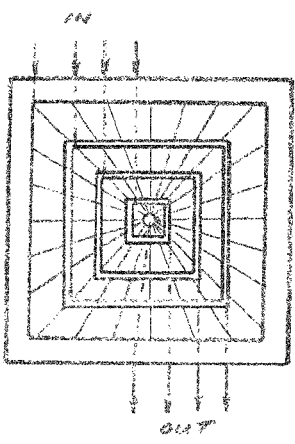

The microchannels (or other cooling channel 28) may be supplied with fluid through one or more "feed" channels 29 (FIG. 3A, for example) hydraulically coupled to the inlet conduit 30. Similarly, fluid exiting a group of microchannels may be routed through one or more "collector" channels 31 hydraulically coupled to the outlet conduit 32. The microchannels between the feed channel(s) 29 and collector channel(s) 31 can have any of various arrangements and/or orientations, which can be configured specifically according to the actual temperature profile of the reticle 12. In various respective examples, the microchannels have a radial arrangement (e.g., FIGS. 3B and 3D), a spiral arrangement (e.g., FIG. 3E, a serpentine arrangement (e.g., FIG. 3C, a rectilinear arrangement (e.g., FIG. 3A), a combination of these arrangements (e.g., FIG. 3F) or other suitable arrangement. (These arrangements are not limited to microchannels; they alternatively may be used with cooling channels 28 that are not so small as to be called "microchannels.") In any of these arrangements, the microchannels can have various transverse profiles, such as (but not limited to) square, rectangular, round, polygonal, or other desired shape. In the transverse profile, the width can be less than, equal to, or greater than the height. A separate system of coolant channels may be located in the region adjacent to the part of the reticle whose obverse side surrounds the flatness quality area of the reticle. This system will limit temperature rise of the reticle's peripheral area that is not illuminated directly by EUV radiation but receives some heat conducted from the adjacent illuminated regions. Equally important, a separate system of coolant channels can be employed to make the temperature variation within the reticle and adjacent regions of the chuck more uniform, thereby reducing thermal distortion within the plane of the reticle.

The cooling channels 28 are separated from the chuck surface 26 by a distance d in the thickness dimension of the reticle chuck 14. The distance d extends from the chuck surface 26 (i.e., the chuck-reticle interface; plane P2) to the top plane P1 of the cooling channels 28, and can be defined by a cover plate 42 fitted inside a corresponding depression in the chuck surface 26. The distance d (and hence the thickness of the plate 42) can range between, for example, 1 mm and 3 mm. The actual value of d depends upon the surface area of the reticle 12 on the reticle chuck 14, the material of the plate 42, the material of the reticle chuck, the area of the reticle chuck that is actually cooled, the configuration of the cooling channels 28, the pressure and flow rate of fluid through the cooling channels, the applicable flatness specification of the reticle, and other variables. The thickness d can also be a consideration when configuring the reticle 12 not to exhibit substantial distortion in the event a particle becomes lodged in the chuck-reticle interface (between the under-surface 24 of the reticle and the chuck surface 26). The cover plate 42 may extend to the outer edges of the chuck 14.

Since the plate 42 provides at least most of the chuck surface 26, the plate 42 desirably is made of the material used for fabricating the reticle chuck 14. Suitable materials have a relatively high thermal conductivity and very low coefficient of thermal expansion. Hence, the ratio of thermal conductivity to coefficient of thermal expansion is very high. Example materials include, but are not limited to, invar, Zerodur, and certain ceramics. The plate 42 is bonded to the reticle chuck 14 by any of various bonding methods including, but not limited to, glass bonding, brazing, frit bonding, and adhesive bonding (such as epoxy bonding). Alternatively, it may be mechanically fastened to the chuck.

As noted earlier above, the reticle 12 and reticle chuck 14 experience various forces during motion of the reticle stage. At least some of the forces arise from rapid start-stop motions or the like of the stage. The start-stop motions involve respective accelerations and decelerations, up to 8×g, for example. As the reticle stage 16 is being accelerated or decelerated in this manner, the movable portion of the reticle stage, the reticle chuck 14, the reticle 12, and anything else affixed to or carried by these components (such as the fluid) are also similarly accelerated or decelerated. Although the fluid in this case is contained in channels and conduits of the reticle chuck 14, the fluid reacts to the forces accompanying acceleration and deceleration. These fluid reactions are analogous to "sloshing" behavior of liquid while being carried in a bucket, and can produce vibrations, distortions, and other undesirable effects on the reticle chuck 14. Hence, these fluid reactions desirably are considered when selecting the coolant fluid, cooling-channel geometry, and value of d. The reticle chuck 14 and reticle 12 desirably can withstand these acceleration and deceleration forces without experiencing excessive distortion, such as X-Y distortion.

These stage motions and their effects on the reticle chuck 14, reticle 12, and cooling fluid are important distinctions of the reticle and reticle chuck from optical elements of the illumination-optical system and imaging-optical system. For example, many of the mirrors of the illumination-optical system of an EUVL system are liquid-cooled. But, since these mirrors normally do not move, they usually do not experience distortions arising from the behavior of contained fluids under acceleration and deceleration conditions.

Also, whereas mirrors of the illumination-optical system or projection-optical system can be provided with flexures or the like to provide additional support (while providing constraints of motion in at least one degree of freedom), it would be difficult to use flexures to support the reticle 12 relative to the reticle chuck 14. The reason is that accelerations and decelerations of the reticle stage 16 would cause movements of the reticle 12 relative to the reticle chuck 14 as the reticle is being supported in this manner, and thus defeat the purpose of the flexures (avoiding transfer of vibrations from the reticle to the reticle stage, and vice versa). This is yet another distinction of the reticle and reticle chuck from an optical element of the illumination-optical system or imaging-optical system.

The two surfaces 24, 26 of the chuck-reticle interface desirably are fabricated to substantially the same flatness tolerances to achieve maximum contact of these surfaces with each other and thus achieve maximum thermal transfer between these surfaces. In other words, the surface structure and finish of the chuck surface 26 affect the tolerance to which at least the reverse surface 24 of the reticle 12 is fabricated. Thus, the cooled reticle chuck 14 removes heat from the reticle 12 in a rapid and efficient manner as the chuck surface 26 helps control the planarity of the reticle.

The plate 42 desirably is configured with consideration given to certain trade-offs. Whereas the plate 42 desirably is as thin as practicable to ensure good and efficient thermal transfer from the reticle 12 to the cooling fluid in the cooling channels 28, a plate having larger surface area generally is thicker than a smaller plate simply to provide the larger plate with sufficient strength. A thicker plate 42 usually better withstands fluid pressures in the cooling channels 28 without flexing. A thicker plate 42 is also less affected by vibrations produced by the fluid in the cooling channels 28 as the fluid experiences accelerations and decelerations and/or as the fluid flows through the cooling channels. A thicker plate 42 also is less likely to sag or otherwise distort and thereby lose the ability to maintain good thermal contact across the chuck-reticle interface.

Also, whereas the material of which a mirror of the illumination-optical system or imaging-optical system is made can be somewhat arbitrary, the material of the reticle chuck 14 (or at least of the cover plate 42) desirably is the same as the material of the reticle 12. The material of the reticle 12 desirably has a low coefficient of thermal expansion and high thermal conductivity. The selected material for the cover plate 42 should be compatible with the expected thermal expansion of the reticle 12. Hence, criteria for the cover plate 42 and other areas of the chuck surface 26 in contact with the reticle include, but are not limited to:

(a) made of a material having low thermal expansion;
(b) made of a material having high thermal conductivity; and
(c) reticle-contact surface is polishable to sub-nanometer flatness.

The cover plate 42 must also provide the necessary electrical structures needed for the electrostatic chucking function, as described below.

As noted, the reticle chuck 14 typically is configured as any of several types of "electrostatic" chucks. The two principal types of electrostatic chucks are Coulombic chucks and Johnsen-Rahbek chucks. Generation of a Coulombic attractive force requires two electrically conductive layers separated from each other by a dielectric. Each of the conductive layers is termed an "electrode." One of the electrodes can be the reticle 12 itself (if made of an electrically conductive material) or an electrically conductive layer on the reticle. The chuck surface 26 (e.g., the surface of the cover plate 42) can be the second electrode, on which is formed a layer of a dielectric material. Thus, whenever the reticle 12 is being held by the reticle chuck 14, the chuck-reticle interface includes the dielectric layer. Imposing a potential difference across the electrodes causes electrostatic attraction of the electrodes, and hence attraction of the reticle 12 to the chuck surface 26. Note that attraction of the reticle to the chuck surface 26 requires that respective electrodes be on both the reticle 12 and the reticle chuck 14. The presence of the dielectric layer at the chuck-reticle interface can decrease thermal conduction between the reticle 12 and reticle chuck 14 compared to configurations lacking the dielectric layer. Hence, with a Coulombic chuck, it is advantageous to cool the reticle chuck in the manner described above to ensure the reticle temperature remains within specifications.

A Johnsen-Rahbek (JR) chuck 14 also has first and second electrodes. The first electrode is located on the reticle and the second electrode is located on the reticle chuck 14 (desirably on the chuck surface 26). The first electrode is made of an electrically conductive (e.g., metal) material, and the second electrode is made of a semiconductor material (e.g., SiC or a ceramic such as Al—Ti ceramic), or vice versa. Appropriate electrical potentials are applied to the two electrodes. Meanwhile, the electrodes must physically contact each other (i.e., there must be good contact of the chuck and reticle at the chuck-reticle interface) to produce the JR attractive force between the electrodes. Stronger JR forces can be produced by increasing the intimacy of surface contact of the first and second electrodes with each other. Under favorable conditions the JR force tends to be stronger than the Coulombic force.

The chuck surface 26 has been discussed above and depicted as a continuous planar surface. Whereas this is an advantageous configuration for many applications, it is contemplated that, for certain other applications, the chuck surface 26 may be discontinuous. Examples of discontinuous chuck surfaces are chuck surfaces defined, at least in part, collectively by the top surfaces of pins, lands, mesas, or analogous features. These top surfaces nevertheless reside in the plane P2 along with other portions of the chuck surface. An advantage of a discontinuous chuck surface is that it may be less susceptible than a continuous chuck surface 26 to particles becoming trapped in the chuck-reticle interface. This decreased susceptibility arises from the simple fact that regions between adjacent lands, pins, mesas, and the like are voids and thus inherently do not pose mating surfaces that would entrap particles. Also, a discontinuous chuck surface may exhibit lower thermal distortion under similar conditions than a continuous planar-surface chuck. However, a chuck having a continuous planar surface, such as shown in FIG. 1, generally achieves better thermal conductivity between chuck and reticle than a discontinuous chuck surface.

Thermal conductivity through the discontinuous chuck surface can be increased by introducing a thermally conductive gas such as He between the surfaces 24 and 26. Means must be provided to seal the peripheral region of the chuck-reticle interface, to prevent leakage of the gas into the surrounding vacuum, and to introduce the gas into the interface after the reticle is chucked, and to remove the gas before the reticle is unchucked.

Second Embodiment

Despite being cooled by the reticle chuck, the reticle may exhibit significant temperature distributions from the reticle surface depth-wise into the reticle and cover plate due to, inter alia, different rates at which different regions of the reticle surface absorb heat from incident radiation and different rates at which heat conducts through the reticle and cover plate to the cooling fluid. Even if the temperature distributions are uniform, they can cause thermal warping of the reticle and/or cover plate. Warping of the cover plate can warp the reticle.

In this embodiment warping of the cover plate is reduced by making the cover plate of multiple (at least two) layers having different coefficients of thermal expansion. The coefficients (and hence the layer materials) are selected so as to offset each other. For example, if a heated cover plate tends to distort in a convex manner, then the cover plate is made with at least one layer that, when heated, tends to urge the convex profile back to a planar profile. The offsetting effects of the two layers are made possible in part by bonding the two layers together firmly to form the cover plate.

Figure 4A:
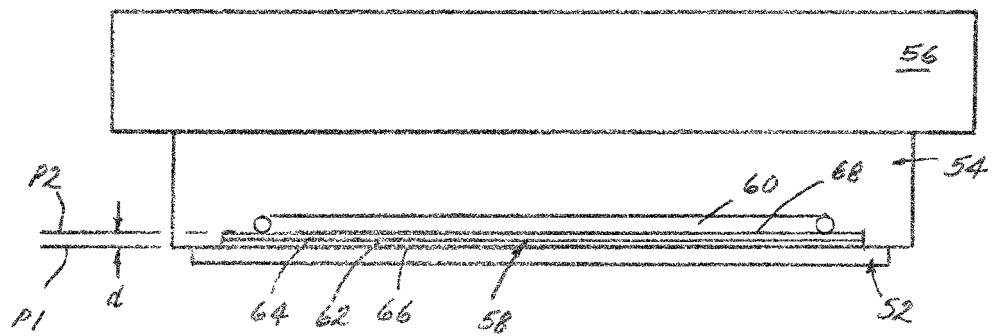
FIG. 4A is an elevational schematic view of a portion of a reticle stage as well as an actively cooled reticle chuck and reticle according to a second embodiment.

An example of this embodiment is shown in FIG. 4A, depicting a planar reticle 52 being held by a reticle chuck 54 mounted to a reticle stage 56. The reticle chuck 54 includes the cover plate 58 and cooling channels 60. The cover plate 58 includes a first layer 62 and a second layer 64 bonded to the first layer. The outer surface 66 of the first layer 62 defines the chuck surface and the plane P2. The inner surface 68 of the second layer 64 defines the plane P1 and contacts the cooling fluid in the cooling channels 60. The first and second layers 62, 64 are made of respective materials having different coefficients of thermal expansion. The coefficients are sufficiently different to offset, at least in part, thermal deformation of one layer relative to the other layer. See U.S. Patent Publication No. 2009/0122428 A1, incorporated herein by reference. Rather than two layers, the cover plate 58 can comprise multiple layers, such as but not limited to, three layers. The individual layers need not have the same thickness, but they can.

In addition to the ability of a multi-layer cover plate 58 to self-correct thermal deformations that otherwise may be exhibited by a single-layer cover plate, a multi-layer cover plate can be more resistant than a single-layer cover plate to forces of acceleration and deceleration of fluid in the cooling channels 60.

Any temperature gradient established in the chuck material above the plane P2, caused by, for example, a temperature rise of the coolant, may cause thermal distortions of the chuck, which can degrade reticle flatness. In addition to an additional coolant plane, as described in the First Embodiment, fabricating this part of the chuck body out of several layers of materials with different thermal properties, as described above, can minimize any thermal distortion effects.

Third Embodiment

Figure 4B:
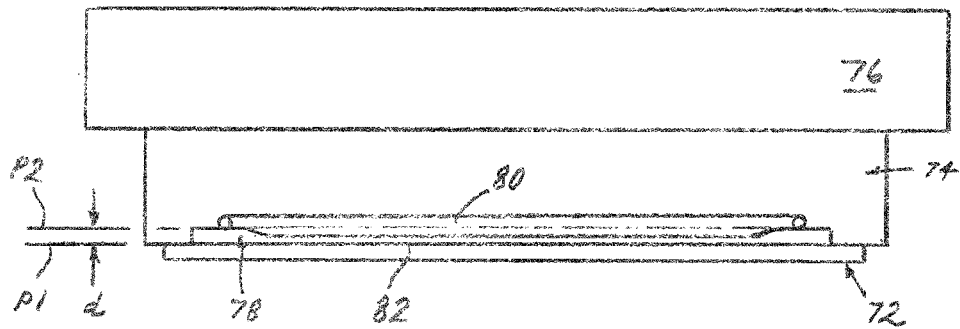
FIG. 4B is an elevational schematic view of a portion of a reticle stage as well as an actively cooled reticle chuck and reticle according to a third embodiment.

The cover plate can have variable thickness. A third embodiment is shown in FIG. 4B, depicting a planar reticle 72 being held by a reticle chuck 74 mounted to a reticle stage 76. The reticle chuck 74 includes a cover plate 78 and cooling channels 80. The cover plate 78 in the depicted configuration is, by way of example, thinner in middle regions than in peripheral regions to provide more rapid thermal transfer from the reticle 72 to the reticle chuck 74 in the middle regions relative to the peripheral regions. It is alternatively possible for the cover plate 78 to be thicker in middle regions than in peripheral regions, or to have a pre-set pattern of variable thickness of the cover plate in different regions thereof. Note that the variations in thickness of the cover plate 78 do not alter the planarity of the chuck surface 82 (plane P1). The variations in thickness desirably are within a range that avoids production of significant vibrations and deformations of the cover plate 78 from circulation of the cooling fluid in the cooling channels 80.

Fourth Embodiment

The cover plate can have "ribs," ridges, or analogous features to add or remove a tendency of the cover plate to distort, for example, in at least one selected one direction relative to another direction, or to correct distortion in at least one selected direction relative to another direction. Thus, the ribs in this example embodiment are located so as to provide the cover plate with an astigmatism or the like that counters a distortion thereof or of the reticle. The astigmatism can be imparted to restore planarity of the chuck surface. See U.S. Patent Publication No. 2009/0122428 A1, incorporated herein by reference. More specifically, the ribs in this example are located on the inside surface of the cover plate (i.e., the surface facing and in contact with the cooling fluid). By locating the ribs on the inside surface of the cover plate, the planarity of the chuck surface (plane P1) need not be compromised by the ribs. The ribs can be arranged according to or with consideration of the arrangement of the cooling channels.

Figure 5A:
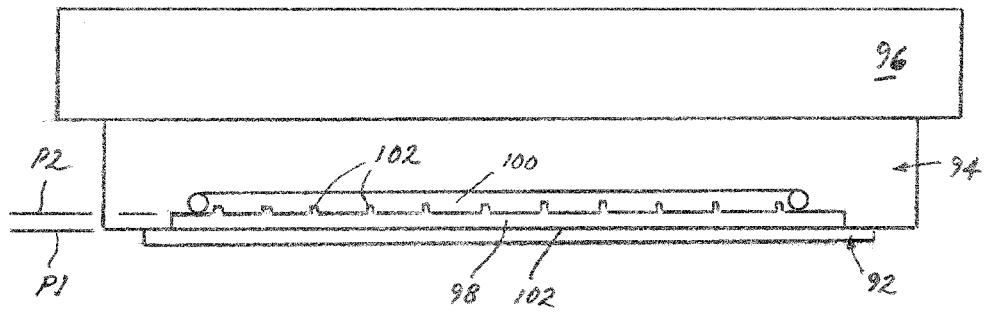
FIG. 5A is an elevational schematic view of a portion of a reticle stage as well as an actively cooled reticle chuck and reticle according to a fourth embodiment.

This embodiment is shown in FIG. 5A, depicting the reticle 92, the reticle chuck 94, and the reticle stage 96. The reticle 92 contacts the chuck surface 102 (plane P1) which is defined at least in part by the cover plate 98. The inside surface of the cover plate 98 (facing the cooling channel 100) includes ribs 104. The ribs 104 are depicted having variable width and variable spacing therebetween to clarify that the particular configuration of the ribs is not limiting. Rather, the configuration can be tailored to the particular target distortion of the reticle or target temperature distribution in the reticle. It is also pointed out that the ribs need not be linearly straight and that the ribs need not have vertical walls and horizontal upper surfaces as shown. Alternatively, for example, the ribs can have rounded sides and tops, and can have any of various arrangements on the inside surface of the cover plate. An example of a complex arrangement of ribs has a fingerprint-like appearance.

It will also be understood that linear ribs such as shown in FIG. 5A need not be unidirectional. Certain embodiments can include a first set of ribs extending, for example, in the X-direction and a second set of ribs extending, for example, in the Y-direction. Also, ribs can cross at 90-degree angles or at any other angle.

Figure 5B:
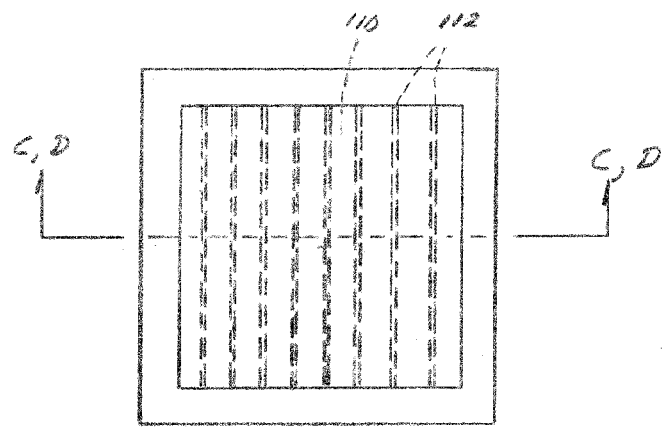
FIG. 5B is a plan schematic view of the reticle-support surface, including ribs, of the fourth embodiment.
Figure 5C:
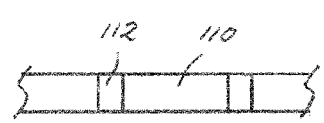
FIG. 5C is an elevational schematic view of a portion of a reticle-support surface, made of a first material and including strips ("ribbons") of a second material having a different coefficient of thermal expansion than the first material.
Figure 5D:
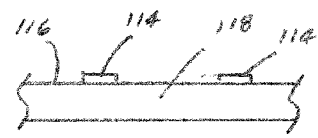
FIG. 5D is an elevational schematic view of a portion of a reticle-support surface, made of a first material, and including surficial ribbons of a second material having a different coefficient of thermal expansion than the first material.

In an alternative embodiment (FIGS. 5B-5C) the ribs are replaced with corresponding strips 112 of a second material, wherein the cover plate 110 is made of a first material, and the first and second materials have different respective coefficients of thermal expansion. Whereas FIGS. 5B-5C depict the strips 112 as having the same thickness as of the cover plate 110, in other example embodiments the strips have a thickness less than the thickness of the cover plate. The strips need not all have the same thickness. Whereas FIG. 5B depicts the strips 112 as extending depthwise through the thickness dimension of the cover plate, in other example embodiments the strips 114 are situated on the inner surface 116 of the cover plate 118 (FIG. 5D).

Precision Assembly

Figure 6:
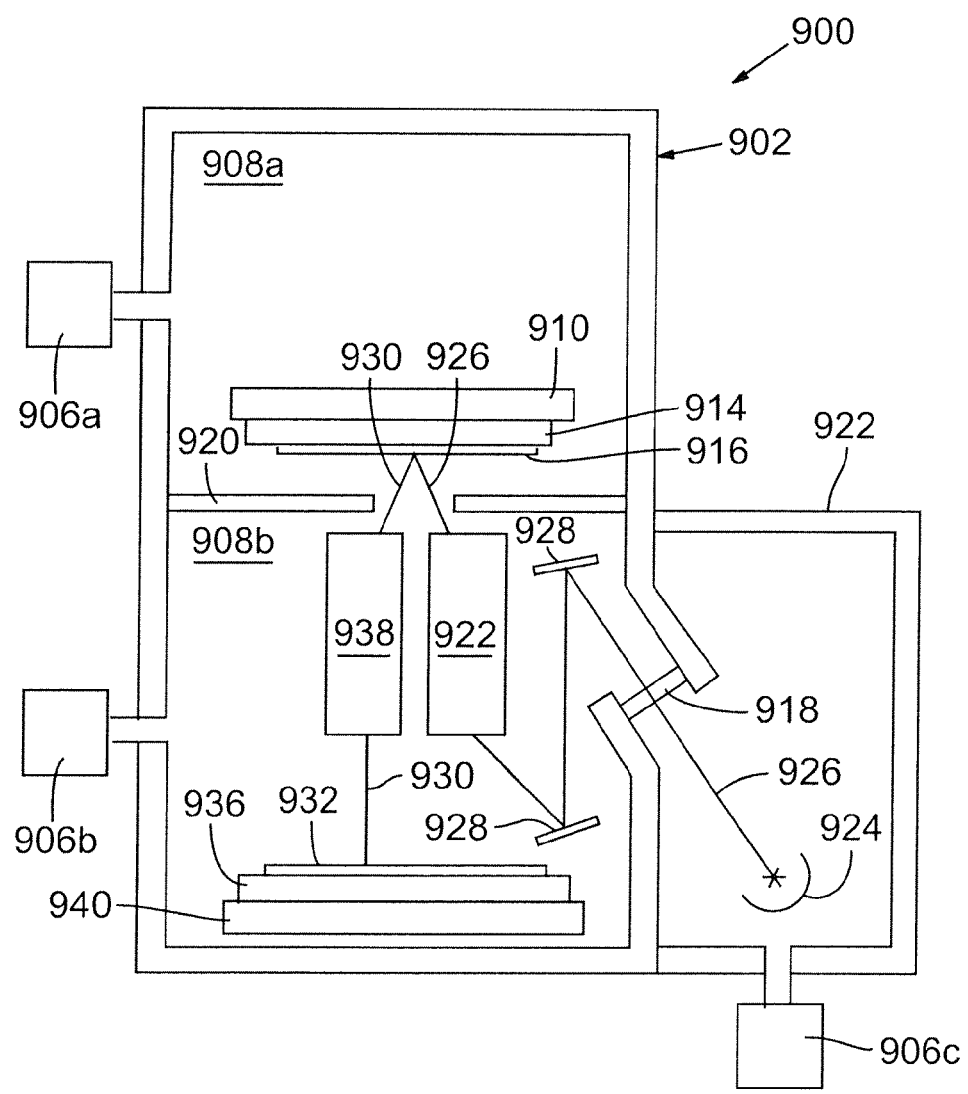
FIG. 6 is a schematic diagram of an embodiment of a precision assembly including an actively cooled reticle chuck as described herein.

FIG. 6 depicts, as a representative precision assembly, an embodiment of an extreme ultraviolet lithography (EUVL) system 900. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

A reticle 916 is held by a reticle chuck 914 mounted to a reticle stage 910. The reticle stage 910 is any of the embodiments described above and/or within the scope of this disclosure. The reticle chuck 914 holds the reticle 916 and allows the reticle to be moved by the stage in a scanning manner, for example, during use of the reticle for making lithographic exposures. An illumination source 924 is contained in a vacuum chamber 922 evacuated by a vacuum pump 906c. The illumination source 924 produces an EUV illumination beam 926 that is transmitted through a neutral density filter 918 and enters the optical chamber 908b. The illumination beam 926 reflects from one or more mirrors 928 and through an illumination-optical system 922 to illuminate the reticle 916. As described above, illumination of the reticle with EUV light heats the reticle; the heat is removed from the reticle by actively cooling the reticle chuck, as described above.

As the illumination beam 926 reflects from the reticle 916, the beam is "patterned" by the pattern portion actually being illuminated on the reticle. The barrier wall 920 defines an aperture 934 through which the illumination beam 926 illuminates the desired region of the reticle 916. The incident illumination beam 926 on the reticle 916 becomes patterned by interaction with pattern-defining elements on the reticle. The resulting patterned beam 930 propagates generally downward through a projection-optical system 938 onto the surface of a wafer 932 held by a wafer chuck 936 on a wafer stage 940 that performs scanning (or other appropriate) motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

Movements of the wafer stage 940 and the reticle stage 910 generate reaction forces that may adversely affect performance of the EUVL system 900. Reaction forces generated by motion of the wafer stage 940 may be released mechanically to the floor or ground via a frame member, as discussed in U.S. Pat. No. 5,528,118 and in Japan Kôkai Patent Document No. 8-166475. Reaction forces generated by motions of the reticle stage 910 may be mechanically released to the floor or ground by use of a frame member as described in U.S. Pat. No. 5,874,820 and Japan Kôkai Patent Document No. 8-330224, all of which being incorporated herein by reference in their respective entireties. Vibrations caused by stage motions also can propagate to various locations in the system, including (but not limited to) vibration-sensitive components of one or both the optical systems. Cooling components that are both vibration-sensitive and thermally sensitive in the manner described above helps isolate the components from such vibrations.

An EUVL system 900 including the above described EUV-source 924 and illumination-optical system 922 can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 922 and projection-optical system 938) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

The subject precision systems are not limited to EUVL systems, to lithography systems utilizing wavelengths other than EUV wavelengths for exposures, or to lithography systems in general. There are a number of different types of lithography systems. For example, the system 900 can be a scanning type lithography system that exposes the pattern from the reticle 916 onto the wafer 932 as the reticle and wafer are moving synchronously. An example of this type of system is a step-and-scan exposure system. During exposure the reticle 916 is moved, in a scanning manner, by the reticle stage 910 as the wafer 932 is being moved in a similar manner by the wafer stage 940. Scanning-exposure of the wafer 932 occurs while the reticle 916 and wafer are moving synchronously.

Alternatively, the exposure system 900 can be a step-and-repeat type of lithography system that exposes the reticle 916 while the reticle and the wafer 932 are stationary. In step-and-repeat, the wafer 932 is in a constant position relative to the reticle 916 and the projection-optical system 938 during the exposure of an individual field. Subsequently, between consecutive exposure steps, the wafer 932 is consecutively moved by the wafer stage 940 in a lateral direction so that the next field of the wafer 932 is brought into position relative to the projection-optical system 938 and the reticle 916 for exposure. Following this process, the images on the reticle 916 are sequentially exposed onto the fields of the wafer 932, and then the next field of the wafer 932 is brought into position relative to the projection-optical system 938 and the reticle.

The use of the system 900 is not limited to photolithography for semiconductor manufacturing. The system 900 can be used, for example, as an LCD photolithography system that exposes a pattern of a liquid-crystal display device onto a rectangular glass plate, or a photolithography system for manufacturing a thin-film magnetic head. Alternatively to a photolithography system, the system 900 may be a charged-particle lithography system such as an electron-beam or ion-beam lithography system.

Alternatively to being an EUV source 924, the source can be a g-line source (436 nm), an i-line source (365 nm), a KrF excimer laser (248 nm), an ArF excimer laser (193 nm), an $F_2$ laser (157 nm) or an electron-beam source. In the case in which an electron beam is used, the structure could be such that either a mask is used or a pattern can be directly forged on a substrate without the use of a mask.

The optical assembly 16 projects and/or focuses the light from the reticle 28 to the wafer 30. Depending upon the configuration of the exposure apparatus 10, the optical assembly 16 can magnify or reduce the image illuminated on the reticle 28.

With an exposure system that employs vacuum-UV (VUV), having a wavelength of 200 nm or lower, one or both the optical systems 922, 938 can be catadioptric. Examples of catadioptric optical systems include the disclosure of U.S. Pat. Nos. 5,668,672 and 5,835,275. See also U.S. Pat. No. 5,689,377 which discusses use of a reflecting-refracting type of optical system incorporating a concave mirror, etc., but without a beamsplitter. As far as is permitted, the disclosures in the above-mentioned U.S. patents and the Japan patent applications are incorporated herein by reference.

The chucks 914, 936 can be vacuum chucks, electrostatic chucks, or some other type of chuck. One or both the stages 910, 940 can include a chuck-mover assembly (not shown) that moves and adjusts the position of the respective chuck 914, 936 relative to the respective stage. For example, the chuck-mover assembly can adjust the position of the respective chuck 914, 936 with one to six degrees of freedom.

The chambers 908a, 908b facilitate the creation of controlled environments around the respective devices in the chambers. The chambers 908a, 908b can be sized and shaped according to the design of the other components of the exposure system 900. The respective thickness and strength of the chambers 908a, 908b depend upon the respective types of controlled environments in them. For example, thicker and stronger walls and hermetic seals are necessary if the controlled environment is a vacuum. Certain operational parameters (longer wavelengths of exposure light) and conditions may obviate the need for one or both chambers.

In lithography systems, when linear motors (see U.S. Pat. No. 5,623,853 or U.S. Pat. No. 5,528,118) are used in the wafer stage 940 or the reticle stage 910, the linear motors can be either an air-levitation type employing air bearings or a magnetic-levitation type using a Lorentz force or reactance force. The stage can move along a guide or be a guideless stage using no guide. As far as is permitted, the disclosures in U.S. Pat. Nos. 5,623,853 and 5,528,118 are incorporated herein by reference.

The reticle stage 910 and wafer stage 940 desirably include respective measurement systems that monitor movements and positioning of the reticle 916 and the wafer 932 relative to suitable references. With this information, a control system (not shown) can control the reticle stage 910 to position the reticle 916 and the wafer stage 940 to position the wafer 932 precisely. The design of the measurement systems can vary. For example, each measurement system can include multiple laser interferometers, encoders, mirrors, and/or other measuring devices.

A controller is electrically connected to the measurement systems, the stages 910, 940, and to other assemblies of the system 900. In one embodiment the controller receives information from the measurement systems and controls motion of the stages to precisely position the reticle chuck 914 (and thus the reticle 916) and the wafer chuck 936 (and thus the wafer 932).

Although the stages 910, 940 have been described above in the context of reticle and wafer stages, respectively, this is not intended to be limiting. In alternative embodiments, one or both stages 910, 940 are used to move other things during manufacturing and/or inspection, to move a specimen under an electron microscope, or to move a workpiece during a precision measurement operation.

Figure 7:
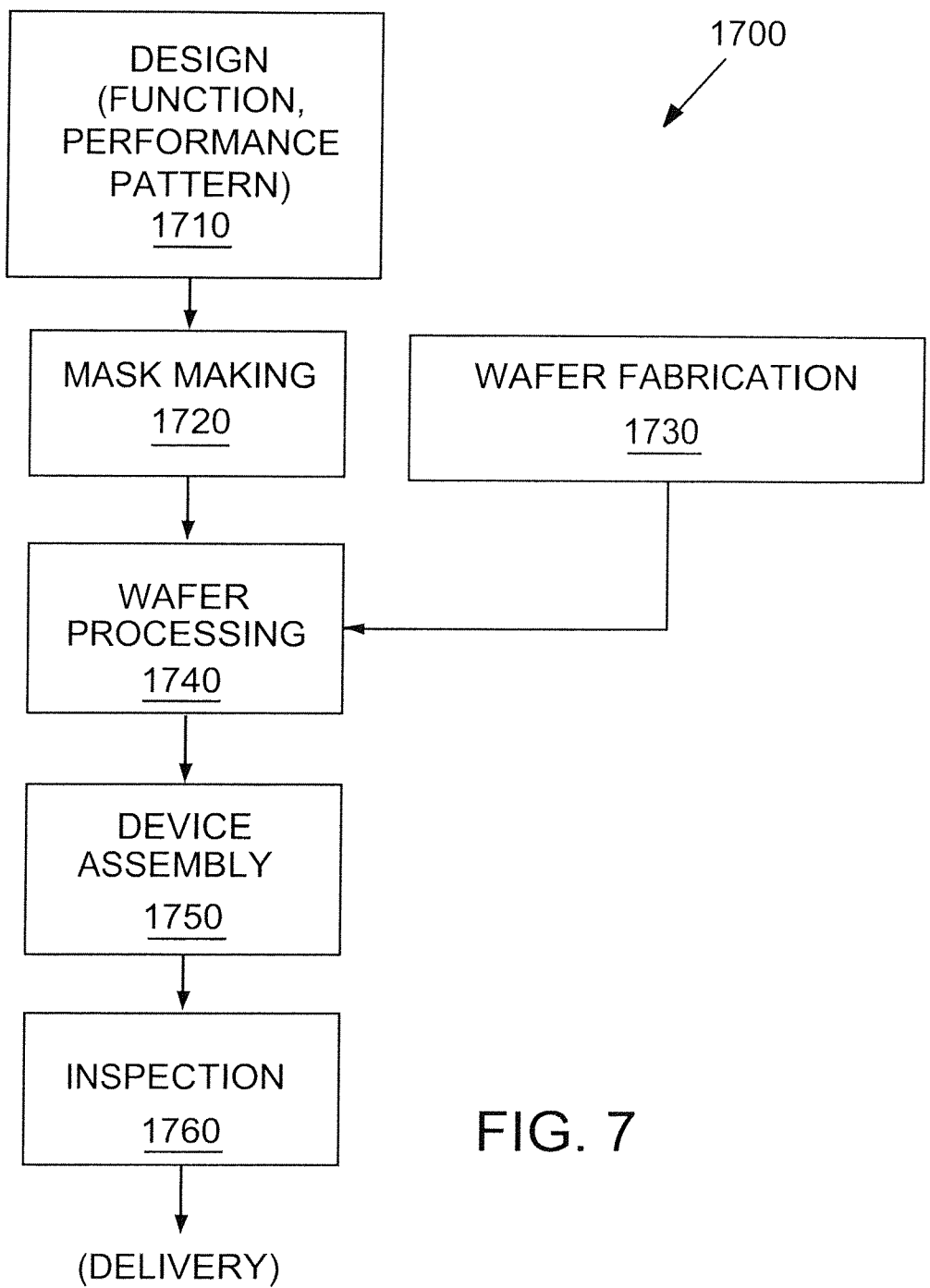
FIG. 7 is a block diagram of a process for fabricating microdevices, wherein the process includes a microlithography step performed using a microlithography system as described herein.

Semiconductor devices can be fabricated by processes including microlithography steps performed using a microlithography system as described above. Referring to FIG. 7, in step 1710 the function and performance characteristics of the semiconductor device are designed. In step 1720 a reticle defining the desired pattern is designed according to the previous design step. Meanwhile, in step 1730, a substrate (wafer) is made and coated with a suitable resist. In step 1740 the reticle pattern designed in step 1720 is exposed onto the surface of the substrate using the microlithography system. In step 1750 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 1760 the assembled devices are tested and inspected.

Figure 8:
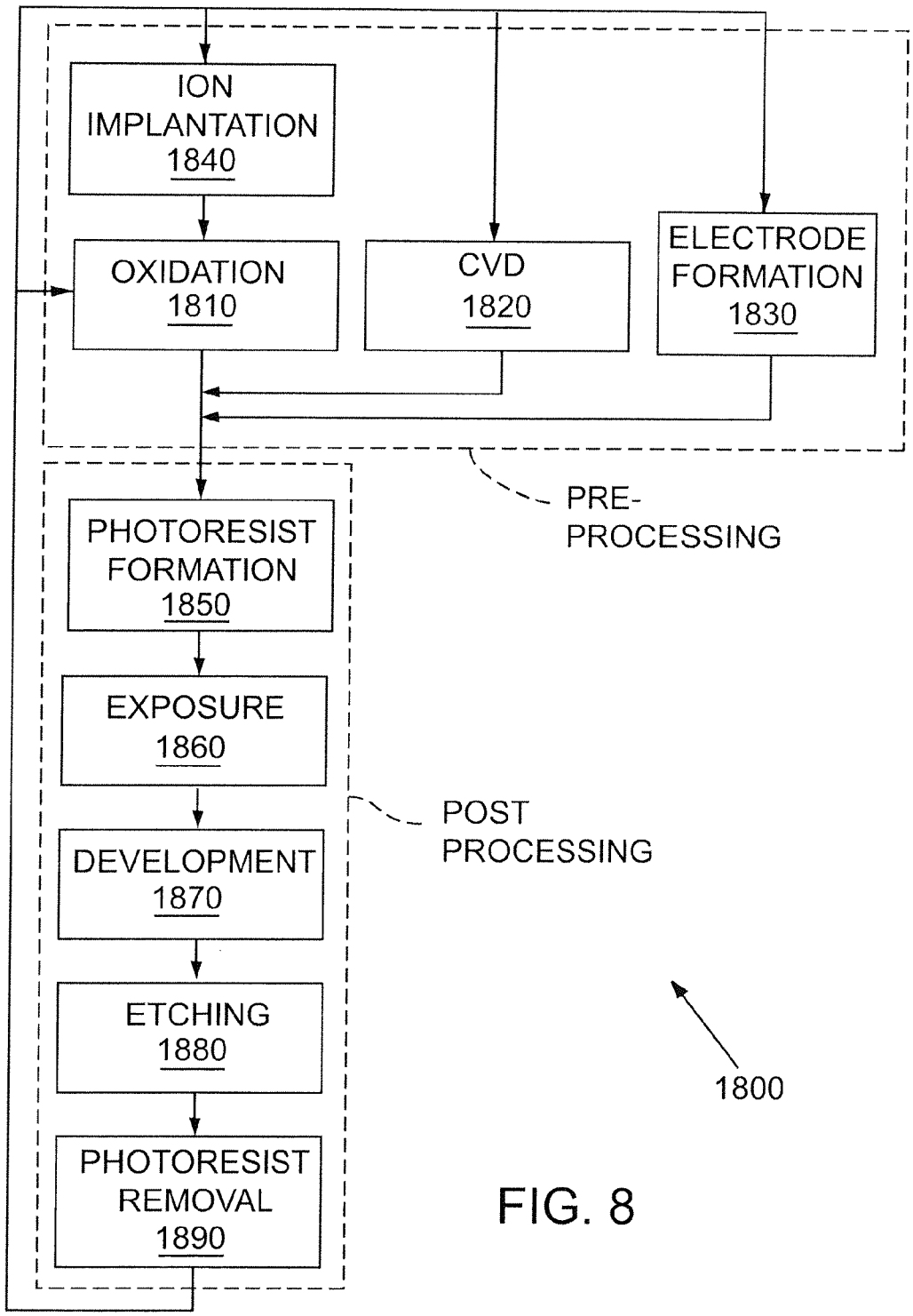
FIG. 8 is a block diagram of a wafer-processing method including a microlithography step.

Representative details of a wafer-processing process including a microlithography step are shown in FIG. 8. In step 1810 (oxidation) the wafer surface is oxidized. In step 1820 (CVD) an insulative layer is formed on the wafer surface. In step 1830 (electrode formation) electrodes are formed on the wafer surface by vapor deposition for example. In step 1840 (ion implantation) ions are implanted in the wafer surface. These steps 1810-1840 constitute representative "pre-processing" steps for wafers, and selections are made at each step according to processing requirements.

At each stage of wafer processing, when the pre-processing steps have been completed, the following "post-processing" steps are implemented. A first post-process step is step 1850 (photoresist formation) in which a suitable resist is applied to the surface of the wafer. Next, in step 1860 (exposure), the microlithography system described above is used for lithographically transferring a pattern from the reticle to the resist layer on the wafer. In step 1870 (development) the exposed resist on the wafer is developed to form a usable mask pattern, corresponding to the resist pattern, in the resist on the wafer. In step 1880 (etching), regions not covered by developed resist (i.e., exposed material surfaces) are etched away to a controlled depth. In step 1890 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

EUVL System

Figure 9:
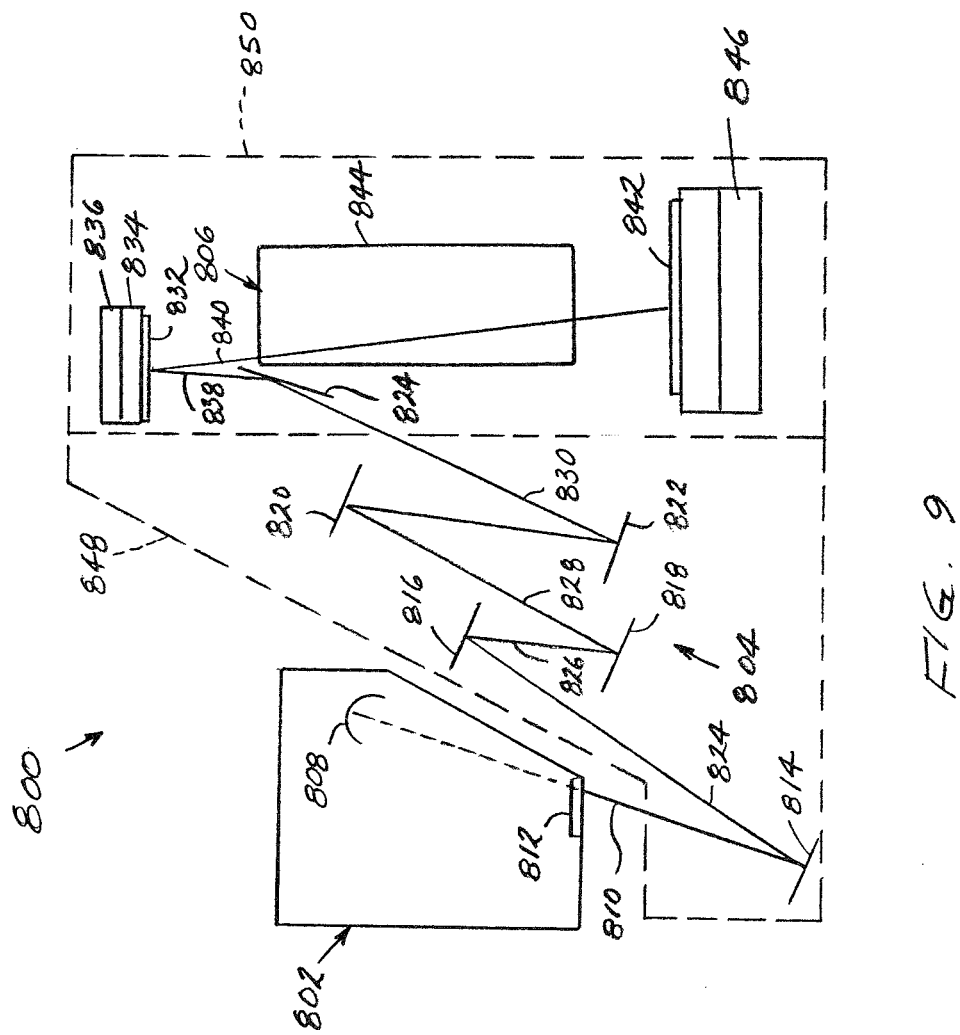
FIG. 9 is a schematic diagram of an EUVL system including an actively cooled reticle chuck as described herein.

Certain other features of an EUVL system 800 are shown in FIG. 9. The depicted system includes an EUV source 802, an illumination-optical system 804, and a projection-optical system 806. The EUV source 802 produces pulses of EUV light from, for example, a laser-induced plasma or electrical-discharge-induced plasma. EUV light from the plasma is gathered by a collector mirror 808 and passed through a filter 812 to the illumination-optical system 804 (beam 810).

The illumination-optical system 804 includes a collimator mirror 814, a first fly-eye mirror 816, a second fly-eye mirror 818, a first condenser mirror 820, a second condenser mirror 822, and a grazing-incidence mirror 824. These mirrors are mounted at respective locations on a rigid frame (not detailed) so as to place the mirrors in proper respective positions relative to each other. Also, all the mirrors of the illumination-optical system 804, except the grazing-incidence mirror 824, are contained in a respective vacuum chamber 848. The collimator mirror 814 collimates the EUV light from the source 802 as the EUV light reflects from the collimator mirror. The collimated light 824 propagates to the first fly-eye mirror 816, from which the light reflects (826) to the second fly-eye mirror 818. The fly-eye mirrors 816, 818 make the illumination intensity of the EUV light substantially uniform over the illumination field. From the second fly-eye mirror 322 the EUV light (828) assumes a gradually convergent characteristic as the EUV light propagates to and reflects from the first and second condenser mirrors 822, 824. From the second condenser mirror 824 the EUV light (830) reflects (at grazing incidence) from the grazing-incidence mirror 328 (usually a planar mirror) and propagates (beam 838) to the reticle 832 where the illumination field illuminates respective selected portions of the reticle pattern at particular instances in time. During illumination the reticle 832 is mounted (reflective-side facing downward) on a reticle chuck 834 that is mounted on a movable reticle stage 836. The reticle stage 836 positions the reticle 832 in three-dimensional space as required for illumination of the desired portions of the reticle pattern by the illumination field at respective instances in time.

The particular type of illumination-optical system 804 shown in FIG. 6 is a six-mirror system. So as to be reflective to incident EUV light at less than grazing angles of incidence, the collimator mirror 814, fly-eye mirrors 816, 818, the condenser mirrors 820, 822, and the reticle 832 have surficial multilayer-interference coatings (e.g., multiple superposed and very thin layer pairs of Mo and Si) that render the surfaces of these mirrors reflective to incident EUV light. Due to the manner in which the EUV light reflects from the grazing-incidence mirror 824 (i.e., at grazing angles of incidence), the grazing-incidence mirror need not have a multilayer coating. In the EUV source 802, the collector mirror 808 also has a multilayer-interference coating.

Because of the lack of suitable reticle-making materials exhibiting significant transparency to EUV light, the reticle 832 is a reflective reticle. EUV light from the grazing-incidence mirror 824 is incident on the reticle 832 at a small angle of incidence (approximately 5 degrees). So as to be reflective to EUV light at such a small angle of incidence, the reticle 832 also has a multilayer-interference coating as well as EUV-absorbent bodies that define, along with spaces between the bodies, the particular pattern on the reticle that is to be transferred to the substrate. Thus, as the EUV light reflects from the irradiated region of the reticle 832, the EUV light is "patterned" by differential reflection of the light from the pattern defined on the reticle. The patterned beam 840 acquires an aerial image of the pattern on the reticle 832 and thus is rendered capable of imaging the illuminated pattern on the surface of the resist-coated substrate 842.

To form the image on the surface of the substrate 842, the "patterned" EUV light 840 reflected from the reticle 832 passes through the projection-optical system 806, which also contains multiple reflective mirrors (not detailed, but typically four or six), to the resist-coated substrate (wafer) 842. During exposure the wafer 842 is mounted (face up) to a wafer chuck that is mounted on a wafer stage 846. The projection-optical system 806, along with the reticle 832 and substrate 842 (and associated stages) are located in a vacuum chamber 850.

It will be apparent to persons of ordinary skill in the relevant art that various modifications and variations can be made to any of the embodiments described above without departing from the spirit and scope of this disclosure.

Whereas the invention has been described in connection with representative embodiments, it will be understood that it is not limited to those embodiments. On the contrary, it is intended to encompass all alternatives, modifications, and equivalents as may be included within the spirit and scope of the invention as defined by the appended claims.

What is claimed is:

1. An apparatus for holding a substantially planar article having a utility obverse surface and a reverse surface, the apparatus comprising:
    a movable body comprising a wall including a contact surface that receives the reverse surface of the article and that is substantially co-extensive with at least a heat-receiving area of the utility surface whenever the article is being held by the movable body, the wall also including a second surface separated from but proximal to the contact surface, the wall being thermally conductive from the contact surface to the second surface;
    a holding device that holds the article to the contact surface with the reverse surface contacting the contact surface; and
    a coolant circulation device that delivers flow of a coolant fluid to the second surface to urge conduction of heat from the contact surface to the second surface; wherein
    the wall comprises respective superposed constituent layers of at least two respective materials, the materials having different respective coefficients of thermal expansion selected such that, at a given temperature and with respect to at least a portion of the layer of material, distortion of one constituent layer is at least partially offset by thermal distortion of the other constituent layer to produce a net reduced distortion of the layer of material compared to when the layer of material comprises only one of the constituent layers; and
    the holding device and coolant-circulation device operate in concert to actively control shape of the article being held by the apparatus.

2. The apparatus of claim 1, wherein the coolant circulation device comprises at least one conduit defined at least in part by the second surface of the wall.

3. The apparatus of claim 2, wherein the coolant fluid is a liquid.

4. The apparatus of claim 3, wherein:
    the coolant circulation device further comprises a pump hydraulically connected to the at least one conduit;
    the pump urges circulation of a coolant liquid through the at least one conduit; and
    the circulating cooling liquid removes heat from the second surface that has conducted from the article to the contact surface and from the contact surface to the second surface.

5. The apparatus of claim 4, wherein the pump circulates the coolant liquid in a substantially laminar flow through the at least one conduit.

6. The apparatus of claim 5, wherein the coolant circulation device further comprises a heat exchanger hydraulically connected to the pump and at least one conduit to remove heat from the circulating coolant liquid.

7. The apparatus of claim 3, wherein the at least one conduit is configured as an array of microchannels.

8. The apparatus of claim 1, wherein:
the holding device comprises first and second electrodes;
the first electrode is located on the contact surface or in the wall;
the second electrode is located on or in the article; and
the electrodes are electrically energizable to produce an electrostatic attraction of the article to the contact surface.

9. The apparatus of claim 8, wherein the electrostatic attraction is a Coulombic attraction.

10. The apparatus of claim 8, wherein the electrostatic attraction is by a Johnsen-Rahbek force.

11. The apparatus of claim 1, wherein the contact area is substantially coextensive with a flatness quality area of the article.

12. The apparatus of claim 1, wherein:
the contact surface defines a first X-Y plane;
the second surface defines a second X-Y plane parallel to the first X-Y plane; and
the first and second X-Y planes are separated from each other in a Z-direction by the wall across which heat is conducted from the contact surface to the second surface.

13. The apparatus of claim 1, wherein the constituent layers are continuous over at least the contact surface.

14. The apparatus of claim 13, wherein at least one of the constituent layers is patterned to provide a non-uniform distribution of thermal expansion coefficient over at least a portion of the respective constituent layer.

15. The apparatus of claim 13, wherein:
one of the constituent layers has a uniform thickness; and
the other of the constituent layers has a non-uniform thickness distribution over at least a portion of the respective constituent layer.

16. The apparatus of claim 1, wherein:
the planar article comprises a reticle; and
the body comprises a movable reticle chuck.

17. The apparatus of claim 1, wherein:
the contact surface faces downward; and
the reverse surface of the article faces upward while the article is being held to the receiving portion by the holding device.

18. A precision system, comprising a holding device as recited in claim 1.

19. An exposure system, comprising a holding device as recited in claim 1.

20. A reticle chuck, comprising:
a chuck body including a chuck surface that receives and contacts a reverse surface of a reticle;
a wall having a first surface being the chuck surface and a second surface located depthwise in the chuck body;
a chuck-cooling device comprising at least one cooling channel situated within the chuck body, the at least one channel circulating a coolant fluid as the coolant fluid contacts the second surface of the wall; and
a first electrode associated with the chuck surface, the first electrode being electrically energizable on demand to produce an electrostatic force attractively holding the reticle to the chuck surface; wherein
the wall comprises respective superposed constituent layers of at least two respective materials, the materials having different respective coefficients of thermal expansion selected such that, at a given temperature and with respect to at least a portion of the wall, distortion of one constituent layer is at least partially offset by thermal distortion of the other constituent layer to produce a net reduced distortion of the wall compared to when the wall comprises only one of the constituent layers.

21. The reticle chuck of claim 20, wherein at least a portion of the first electrode is located on the chuck surface.

22. The reticle chuck of claim 20, wherein the first electrode is situated in the chuck body depthwise from the chuck surface.

23. The reticle chuck of claim 20, wherein:
the reticle comprises a second electrode associated with the reverse surface of the reticle;
the first electrode is aligned with the second electrode whenever the reticle is being held by the chuck; and
the second electrode is electrically energizable on demand in coordination with energization of the first electrode to facilitate production of the electrostatic force.

24. The reticle chuck of claim 23, wherein the first and second electrodes are electrically connected to produce a Coulombic attractive force holding the reticle to the chuck surface.

25. The reticle chuck of claim 23, wherein the first and second electrodes are electrically connected to produce a Johnsen-Rahbek attractive force holding the reticle to the chuck surface.

26. The reticle chuck of claim 20, wherein:
the at least one cooling channel defines a first X-Y plane;
the chuck surface defines a second X-Y plane parallel to the first X-Y plane; and
the first and second X-Y planes are separated from each other in a Z-direction by the wall.

27. The reticle chuck of claim 20, wherein the chuck surface is substantially planar over a region thereof corresponding at least to a flatness quality area of the reticle.

28. The reticle chuck of claim 20, wherein the cooling device further comprises a pump hydraulically connected to the at least one cooling channel, the pump being operable on demand to urge substantially laminar flow of the cooling fluid through the at least one cooling channel.

29. The reticle chuck of claim 28, wherein the cooling fluid is a liquid.

30. The reticle chuck of claim 28, wherein the cooling device further comprises a heat exchanger hydraulically connected to the pump and at least one cooling channel to remove heat from the cooling fluid.

31. The reticle chuck of claim 20, wherein the constituent layers are continuous over at least the chuck surface.

32. The reticle chuck of claim 31, wherein at least one of the constituent layers comprises a predetermined pattern of structural or compositional features providing the layer with a non-uniform distribution of thermal expansion coefficient over at least a portion of the respective constituent layer.

33. The reticle chuck of claim 31, wherein:
one of the constituent layers has a uniform in thickness; and
the other of the constituent layers has a predetermined pattern of structural features arranged to provide a non-uniform distribution of thickness over at least a portion of the respective constituent layer.

34. The reticle chuck of claim 33, wherein:
the at least one cooling channel defines a first X-Y plane;
the chuck surface defines a second X-Y plane parallel to the first X-Y plane;
the first and second X-Y planes are separated from each other in a Z-direction by the wall; and the variable thickness distribution is manifest as ribs extending in the X-Y plane.

35. An exposure system, comprising a reticle chuck as recited in claim 20.

36. A lithography system, comprising:
an illumination-optical system;
an imaging-optical system located downstream of the illumination-optical system;
a reticle stage situated between the illumination-optical system and imaging-optical system; and
an electrostatic reticle chuck, as recited in claim 20, mounted to the reticle stage.

37. The lithography system of claim 36, wherein the reticle is a reflective reticle.

38. The lithography system of claim 36, wherein the lithography system is an EUVL system.

39. A method for controlling planarity of a movable, thermally conductive article, comprising:
providing a movable body having a wall including an article-contact surface;
separating the article-contact surface from a hydraulic channel extending in the movable body;
placing a thermally conductive article on the article-contact surface such that a reverse surface of the article contacts the article-contact surface, an obverse surface of the article faces away from the article-contact surface, and thermal conduction is established between the article-contact surface and the reverse surface;
producing a force attracting the article to the article-contact surface; and
cooling the reverse surface to remove heat from the body and hence from the article,
wherein the wall comprises respective superposed constituent layers of at least two respective materials, the materials having different respective coefficients of thermal expansion selected such that, at a given temperature and with respect to at least a portion of the wall, distortion of one constituent layer is at least partially offset by thermal distortion of the other constituent layer to produce a net reduced distortion of the wall compared to when the wall comprises only one of the constituent layers.

40. The method of claim 39, wherein the step of producing a force comprises producing a Coulombic attractive force between the article and the article-contact surface.

41. The method of claim 39, wherein the step of producing a force comprises producing a Johnsen-Rahbek attractive force between the article and the article-contact surface.

42. A method for making an exposure system, comprising steps of providing a movable body configured to attractively hold a planar article, and removing heat from the body as recited in claim 39.

43. A method for making a patterned lithographic substrate, utilizing an exposure system made by the method recited in claim 42.

44. A method for making a micro-device, utilizing an exposure system made by the method recited in claim 42.

* * * * *